United States Patent [19]

Cho

[11] Patent Number: 5,418,859

[45] Date of Patent: May 23, 1995

[54] CORRECTING APPARATUS OF SOUND SIGNAL DISTORTION BY WAY OF AUDIO FREQUENCY BAND SEGMENTATION

[75] Inventor: Hyong-Guk Cho, Suwon, Rep. of Korea

[73] Assignee: Samsung Electronics Co., Ltd., Kyungki, Rep. of Korea

[21] Appl. No.: 109,927

[22] Filed: Aug. 23, 1993

[30] Foreign Application Priority Data

Aug. 22, 1992 [KR] Rep. of Korea ............ 92-15114

[51] Int. Cl.[6] .......................................... H04B 1/12
[52] U.S. Cl. .......................... 381/98; 381/103; 381/106
[58] Field of Search ................. 381/98, 103, 106

[56] References Cited

U.S. PATENT DOCUMENTS 4,888,808 12/1989 Ishikawa et al. ............... 351/103

FOREIGN PATENT DOCUMENTS 63-50195 3/1988 Japan .
2269969 2/1994 United Kingdom .

Primary Examiner—Curtis Kuntz
Assistant Examiner—Mark D. Kelly
Attorney, Agent, or Firm—Sughrue, Mion, Zinn, Macpeak & Seas

[57] ABSTRACT

The present invention relates to a correcting apparatus of sound signal distortion by way of an audio frequency pass segmentation, the apparatus comprising: frequency band segmentation means for segmenting an audio frequency band sampled by a predetermined frequency into a plurality of bands; decimation means for performing a decimation in respectively different ratios in accordance with a sound data band band-segmented by the frequency band segmentation means; distortion correcting means for performing a distortion correcting on the sound data decimated from the decimation means per band; and data output means for synchronizing the sound data distortion-corrected at the distortion correcting means so that the sound data can be in the same order as the sound data when input to the frequency band segmentation means to thereby b output in synthesis. According to the present invention, the audio frequency band is segmented into a plurality of frequency bands by way of a Bark Scale for illustrating man's sound distinguishing calibre in the audio frequency band, and in the low frequency band the sampling numbers of sound data are increased whereas in the high frequency band, the sampling numbers are decreased.

14 Claims, 2 Drawing Sheets

5,418,859

CORRECTING APPARATUS OF SOUND SIGNAL DISTORTION BY WAY OF AUDIO FREQUENCY BAND SEGMENTATION

BACKGROUND OF THE INVENTION

1. Field of the Invention

The present invention relates to a correcting apparatus for sound signal distortion, and more particularly to a correcting apparatus for sound signal distortion by way of an audio frequency band segmentation for correcting the sound signal distortion utilizing a Bark Scale that represents a sound distinguishing capacity of man in such systems as sound recognizing instruments, sound reproducing instruments, transducers, accurate sensors and the like calling for linear characteristics. The present disclosure is based on the disclosure of Korean Application No. 92-15114 filed Aug. 22, 1992, which disclosures are incorporated herein by reference.

2. Description of the Prior Art

Most sound instruments change an electrical signal to a mechanical signal, so that a sound signal is generated by the mechanical signal that creates a vibration.

In such processes, an original sound signal is distorted by a transfer function possessed by the system.

Accordingly, before the electrical signal is converted to the mechanical signal, the distortion created by the aforesaid transfer function can be corrected by applying an electrical signal corresponding to an inverse function of the transfer function via a digital signal processing (DSP) filter.

In order to correct distortion by use of a DSP filter, a sampling should be made in a frequency band reproduced by a speaker.

However, because sampling on an entire audio frequency band has been conventionally done on an even interval, an accurate distortion correction could be possible on almost all the frequencies if the sampling frequency increases, but this causes a problem in that the number of circuit elements comprising the DSP filter increases greatly.

If the sampling frequency is decreased, the number of circuit elements comprising the filter decreases but the problem is that the accuracy of the distortion correction deteriorates.

For example, in Japanese Laid Open Patent Application No. Sho. 63-50195 (1988) entitled "Audio Signal Transmission System," a technique has been proposed whereby a signal is segmented in accordance with a result of spectrum analysis for an input audio signal when the input signal is performed by a signal segmentation according to respective frequency bands in order to cope with the plurality of output means.

In other words, in order to faithfully reproduce the entire band of the audio signal (in order to minimize the distortion), a technique has been provided to segment the frequency bands in accordance with the spectrum of the analyzed audio signal.

According to the Japanese Laid Open Patent Application No. Sho. 63-50195, the audio signal transmission system can prevent generation of crossover distortion for a desired characteristic, but there has been no way to solve the aforementioned problems.

SUMMARY OF THE INVENTION

Accordingly, it is an object of the present invention to provide a correcting apparatus for sound signal distortion by way of audio frequency band segmentation utilizing a Bark Scale for representing man's sound distinguishing caliber in the audio frequency bands to thereby divide the audio frequency bands into a plurality of frequency bands, and to decrease the number of samplings in high frequency bands by increasing the number of samplings of the sound signal in low frequency bands to thereby comprise an effective DSP filter with fewer circuit elements.

In accordance with the object of the present invention, there is provided a correcting apparatus for sound distortion by way of an audio frequency band segmentation, the apparatus comprising: a frequency band segmentation means for segmenting an audio frequency band sampled by a predetermined frequency into a plurality of bands; a decimation means for performing a decimation in respectively different ratios in accordance with a sound data band band-segmented by the frequency band segmentation means; a distortion correcting means for performing a distortion correction on the sound data decimated from the decimation means per band; and a data output means for synchronizing the sound data distortion-corrected at the distortion correcting means, so that the sound data can be in the Same order as the sound data when applied as an input to the frequency band segmentation means to thereby be output in synthesis.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

Hereinafter, an embodiment of a correcting apparatus for sound signal distortion by way of an audio frequency band segmentation in accordance with the present invention will be described in detail with reference to the accompanying drawings.

A Bark Scale is provided for showing a capacity (audiogenic resolution) for distinguishing a sound signal having respectively different frequencies in the audio frequency band.

In the Bark Scale, man's audiogenic resolution is represented in a frequency domain.

Figure 1:
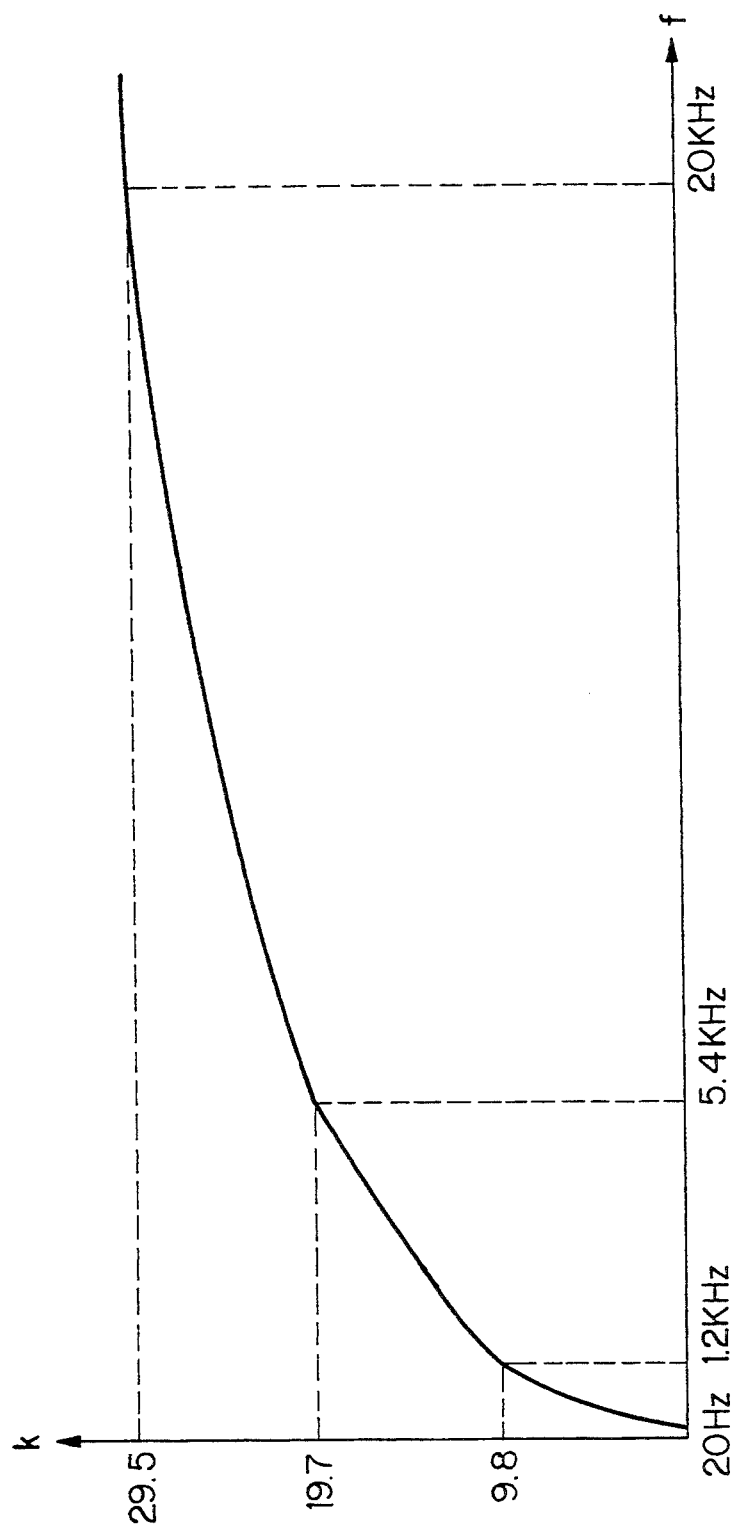
FIG. 1 is a Bark Scale.

As shown in FIG. 1, an audio frequency band of 20 Hz–20 KHz is represented in an exponent for distinguishing the Bark Scale.

The man's audiogenic resolution is displayed as a curve incline in the Bark Scale illustrated in FIG. 1.

The man's audiogenic resolution has a low frequency domain changes more rapidly than a high frequency domain.

In other words, man is more apt to detect easily a frequency variation of the sound signal with a steeper curve slant in the low frequency domain and is more apt to detect with difficulty the frequency variation of the sound signal with a gentler curve incline in the high frequency domain.

Figure 2:
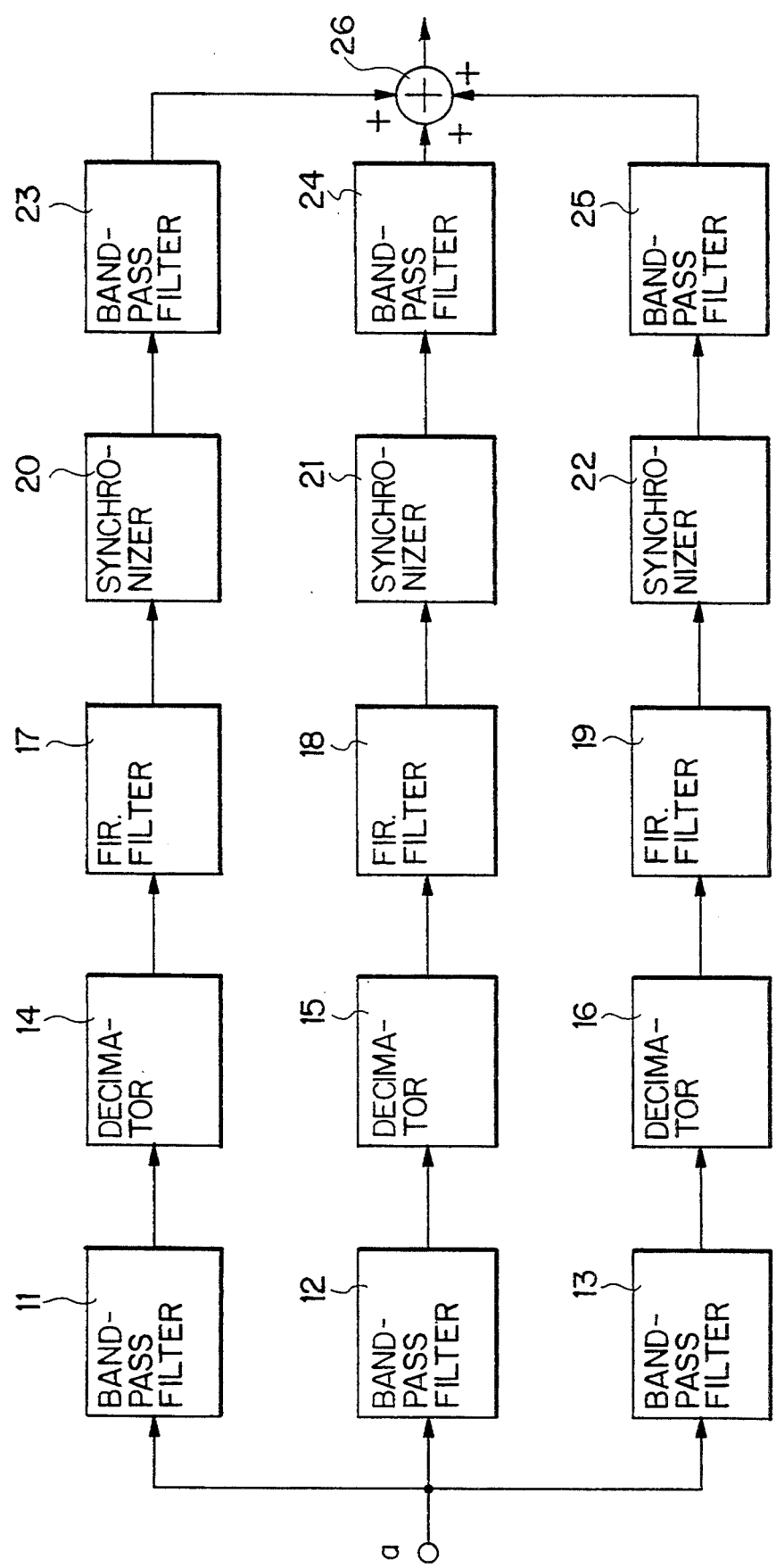
FIG. 2 is an embodiment of a correcting apparatus for sound signal distortion by way of audio frequency band segmentation in accordance with the present invention.

FIG. 2 is a block diagram for illustrating a correcting apparatus of sound signal distortion by way of an audio frequency band segmentation in accordance with an embodiment of the present invention.

In FIG. 2, the frequency band segmentation means for segmenting the audio frequency band sampled by a predetermined frequency into a plurality of bands comprises a first band pass filter 11, a second band pass filter 12 and a third band pass filter 13.

The first, second and third band pass filters 11, 12 and 13 have respectively different frequency pass bands.

In other words, the filters have frequency pass bands in accordance with the Bark Scale.

The decimation means for performing a decimation in respectively different ratios in accordance with the sound data bands band-segmented by the frequency band segmentation means comprises three decimators 14, 15 and 16.

The distortion correcting means for distortion-correcting per band the sound data decimated from the decimation means comprises finite impulse response (FIR) filters 17, 18 and 19 for performing the finite impulse response.

The data output means wherein the sound data distortion-corrected by the distortion correcting means is synchronized in order to be in the same order as the sound data when input into the frequency band segmentation means to thereby be output in synthesis comprises synchronizers 20, 21 and 22 and a fourth, fifth and sixth band pass filters 23, 24 and 25 and an adder 26.

The synchronizers 20, 21 and 22 in the data output means restructure time-wise the data output from the FIR filters 17, 18 and 19 in order that the output can be in the same order with the sound data when input.

The fourth, fifth and sixth filters 23, 24 and 25 eliminate noise of the data output from the synchronizers 20, 21 and 22.

Here, the first, second and third band pass filters 11, 12 and 13 on the same line with the fourth, fifth and sixth band pass filters 23, 24 and 25 are constructed to have the same frequency pass bands.

The adder 26 adds the data output from the synchronizers 20, 21 and 22 to thereafter output the sum.

Accordingly, when sound data of an audio frequency band sampled at a predetermined sampling frequency (generally 44.1 KHz) is input to the apparatus of FIG. 2 through an input terminal a, the first, second and third band pass filters 11, 12 and 13 divide the sound data into three frequency bands according to the exponent k in the Bark Scale as illustrated in FIG. 1.

The first band pass filter 11 passes a sound data of the first frequency band (20 Hz–1.2 KHz) which has an exponent k of 0–9.8, the second and third band pass filters 12 and 13 pass sound data of the second and third frequency bands (1.2 KHz–5.4 KHz, 5.4 KHz–20 KHz) which have exponents k of 9.8 KHz–19.7 KHz and 19.7 KHz–29.5 KHz respectively, thereby dividing the sound data into three frequency bands.

When the sound data divided into three frequency bands is applied to the first, second and third decimators 14, 15, 16, the respective decimators decimate the input sound data at a prescribed ratio.

The first decimator 14 selects one out of 15 data samples to thereafter output the same, and performs a 15-to-1 decimation, disregarding the balance 14 data samples.

The second decimator 15, operating in the same manner as in the first decimator 14, selects one data sample out of every three data samples to thereby output the same and performs a 3-to-1 decimation, disregarding the balance 2 data samples.

The third decimator 16 performs a 1-to-1 decimation to thereby output the inputted data as it is.

Here, the 3-to-1 decimation is 14.7 KHz which is one-third of the sampling frequency of the sound data at the input terminal a, which is actually the same as the sampled sound data.

In other words, one data out of three data samples in a sampling frequency of 44. KHz is selected to thereby output the same, which becomes the same as the sound data input at 14.7 KHz (=44.1 KHz/3). Accordingly, the output data of the first decimator 14 which is 2.94 KHz (=44.1 KHz/15) actually becomes the same as the result of the sampled sound data.

The FIR filters 17, 18 and 19 correct amplitude distortions and phase distortions of the distorted data output from the decimators 14, 15 and 16.

If the FIR filters are equipped with a total of 200 taps, the first, second and third frequency bands will respectively have 34, 68 and 98 taps.

Accordingly, the resolution for each band can be obtained by sampling frequency/(tap number×decimation ratio), which reads as below:

TABLE 1

| Band | Bark Scale | Frequency Range | Tap Number | Resolution |
|---|---|---|---|---|
| 1st | 0–9.8 | 20 Hz–1.2 KHz | 34 | ~90 Hz |
| 2nd | 9.8–19.7 | 1.2 KHz–5.4 KHz | 68 | ~200 Hz |
| 3rd | 19.7–29.5 | 5.4 KHz–20 KHz | 98 | ~450 Hz |

In other words, the respective resolutions at the first, second and third bands read as "44.1 KHz/(34×15)≈90 Hz," "44.1 KHz/(68×3)≈200 Hz" and 44.1 KHz/(98×10)≈450 Hz."

In the above table, the frequency ranges and Bark Scales corresponding to each band are identical to the ones in FIG. 1, and the number of taps is determined in consideration of man's audiogenic resolution in each frequency band and integrated circuits comprising the taps and the like.

Therefore, the first FIR filter 17 has 34 taps, the second and third FIR filters 18 and 19 are constructed to have 68 and 98 taps, respectively.

In the above Table 1, the resolution of 90 Hz implies that a frequency difference between the predetermined sound data and another predetermined sound data is 90 Hz.

When the distortion-corrected sound data are output from the respective FIR filters having mutually different taps, the synchronizers 20, 21 and 22 connected to the outputs of the FIR filters synchronize the sound data input in accordance with a predetermined controller command (not shown).

In other words, the sound data decimated and filtered by band segmentation are connected time-wise in order that they can be placed in the same order as the sound data passing through the input terminal a.

The data output from the first synchronizer 20 is re-filtered by the fourth band pass filter 23 to thereby be removed of the noises, and the data output from the second and third synchronizers 21 and 22 are removed of the noises by the fifth and sixth band pass filters 24 and 25, respectively.

The sound data removed of the noises by the above-mentioned fourth, fifth and sixth band pass filters 23, 24 and 25 have the same frequency bands respectively as the frequency pass bands of the first, second and third band pass filters 11, 12 and 13 situated on the same line.

The adder 26 adds the sound data which have been removed of the noises by the fourth, fifth and sixth band pass filters 23, 24 and 25 so that the same can be output.

According to the correcting apparatus of sound signal distortion by way of audio frequency band segmentation in accordance with the present invention, there is an effect of constructing the DSP filters effectively with a fewer number of circuit elements by utilizing man's audiogenic resolutions.

The foregoing description and drawings are illustrative and are not to be taken as limiting. Still other variations and modifications are possible without departing from the spirit and scope of the present invention.

Specifically, in the aforesaid embodiment, the audio frequency band has been segmented into three bands to thereby materialize the present invention but, according to the applied objects, the bands can be increased or decreased.

What is claimed is:

1. A correcting apparatus of sound signal distortion by way of an audio frequency band segmentation comprising:
    frequency band segmentation means for segmenting an audio frequency band sampled by a predetermined frequency into a plurality of bands, wherein the frequency band segmentation means segments the audio frequency band according to a Bark Scale;
    decimation means for performing a decimation in respectively different ratios in accordance with a sound data band band-segmented by the frequency band segmentation means;
    distortion correcting means for performing a distortion correction on the sound data decimated from the decimation means per band; and
    data output means for synchronizing the sound data distortion-corrected at the distortion correcting means, so that the sound data can be in the same order as the sound data when input to the frequency band segmentation means to thereby be output in synthesis.

2. A correcting apparatus of sound signal distortion by way of an audio signal frequency band segmentation as defined in claim 1, wherein the frequency band segmentation means comprises a plurality of band pass filters for segmenting the audio frequency band according to the Bark Scale.

3. A correcting apparatus of sound signal distortion by way of an audio frequency band segmentation as defined in claim 2, wherein the band pass filter comprises at least more than two filters.

4. A correcting apparatus of sound signal distortion by way of an audio frequency band segmentation as defined in claim 1, wherein the decimation means comprises a plurality of decimators for performing the decimations with mutually different decimation ratios.

5. A correcting apparatus of sound signal distortion by way of an audio frequency band segmentation as defined in claim 4, wherein the decimation means comprises at least more than two decimators.

6. A correcting apparatus of sound signal distortion by way of an audio frequency band segmentation as defined in claim 1, wherein the distortion correcting means comprises finite impulse response filters for distortion-correcting the sound data per band.

7. A correcting apparatus of sound signal distortion by way of an audio frequency band segmentation as defined in claim 1, wherein the data output means comprises synchronizers for synchronizing the sound data in the same order as the sound data when input into the frequency band segmentation means.

8. A correcting apparatus of sound signal distortion by way of an audio frequency band segmentation as defined in claim 7, wherein the data output means comprises:
    band pass filters for removing noises of the data synchronized at the synchronizers per band; and
    an adder for combining the data removed of the noises per band at the band pass filters.

9. A correcting apparatus of sound signal distortion by way of an audio frequency band segmentation as defined in claim 8, wherein the band pass filters have the same frequency pass bands as the band pass filters in the frequency band segmentation means.

10. A correcting apparatus of sound signal distortion by way of an audio signal frequency band segmentation as defined in claim 1, wherein the frequency band segmentation means comprises a plurality of band pass filters for segmenting the audio frequency band according to the Bark Scale.

11. A correcting apparatus of sound signal distortion by way of an audio frequency band segmentation as defined in claim 3, wherein the plurality of band pass filters are comprised of three band pass filters with pass bands of 20 Hz to 1.2 kHz, 1.2 kHz to 5.4 kHz, and 5.4 kHz to 20 kHz, respectively.

12. A correcting apparatus of sound signal distortion by way of an audio frequency band segmentation as defined in claim 4, wherein the plurality of decimators are comprised of three decimators with decimation ratios of 15-to-1, 3-to-1, and 1-to-1, respectively.

13. A correcting apparatus of sound signal distortion by way of an audio frequency band segmentation as defined in claim 6, wherein the distortion correction means comprises three finite impulse response filters with taps of 34, 68 and 98, respectively corresponding to first through third frequency bands.

14. A correcting apparatus of sound signal distortion by way of an audio frequency band segmentation as defined in claims 8, wherein the band pass filters are comprised of three band pass filters with pass bands of 20 Hz to 1.2 kHz, 1.2 kHz to 5.4 kHz, and 5.4 kHz to 20 kHz, respectively.

* * * * *